US009268086B2

(12) United States Patent
Witzens

(10) Patent No.: US 9,268,086 B2
(45) Date of Patent: Feb. 23, 2016

(54) INTEGRATED MICROTOROIDS MONOLITHICALLY COUPLED WITH INTEGRATED WAVEGUIDES

(75) Inventor: Jeremy Witzens, Aachen (DE)

(73) Assignee: RWTH AACHEN (DE)

( * ) Notice: Subject to any disclaimer, the term of this patent is extended or adjusted under 35 U.S.C. 154(b) by 362 days.

(21) Appl. No.: 13/878,852

(22) PCT Filed: Oct. 13, 2011

(86) PCT No.: PCT/EP2011/067934
§ 371 (c)(1),
(2), (4) Date: Apr. 11, 2013

(87) PCT Pub. No.: WO2012/049271
PCT Pub. Date: Apr. 19, 2012

(65) Prior Publication Data
US 2013/0195401 A1    Aug. 1, 2013

Related U.S. Application Data

(60) Provisional application No. 61/393,170, filed on Oct. 14, 2010, provisional application No. 61/437,668, filed on Jan. 30, 2011.

(51) Int. Cl.
| G02B 6/12 | (2006.01) |
| G02B 6/26 | (2006.01) |
| G02B 6/10 | (2006.01) |
| G02B 6/122 | (2006.01) |
| G02B 6/125 | (2006.01) |

(Continued)

(52) U.S. Cl.
CPC  *G02B 6/12* (2013.01); *G02B 6/125* (2013.01); *G02B 6/12007* (2013.01); *G02B 6/1221* (2013.01); *G02B 6/132* (2013.01); *G02B 6/136* (2013.01); *G02B 6/29338* (2013.01); *H01L 33/58* (2013.01)

(58) Field of Classification Search
CPC ...... G02B 6/12; G02B 6/12007; G02B 6/122; G02B 6/1221; G02B 6/125; G02B 6/132; G02B 6/136; G02B 6/29338; G02B 6/26; G02B 6/43; H04B 10/00; H04B 10/12; H04B 10/801; H04B 10/803; H01L 33/58
USPC ............ 385/12–13, 14, 39, 50, 88–92, 385/129–132; 438/31; 264/1.24, 2.5; 216/24; 361/600, 679.01; 398/135–142; 439/296
See application file for complete search history.

(56) References Cited

U.S. PATENT DOCUMENTS

| 2008/0001062 A1 | 1/2008 | Gunn et al. | |
| 2008/0095490 A1* | 4/2008 | Ashkenazi et al. | ............. 385/13 |

OTHER PUBLICATIONS

Chen, Long, et al., "Compact Bandwidth Tunable Microring Resonators", Laser and Electro-Optics, May 4, 2008, pp. 1-2, IEEE, Piscataway, NJ, USA.

(Continued)

*Primary Examiner* — Akm Enayet Ullah
*Assistant Examiner* — Michael Mooney
(74) *Attorney, Agent, or Firm* — McCarter & English, LLP

(57) ABSTRACT

A photonic apparatus comprises an integrated waveguide, an integrated resonator in the form of a microtoroid and a thermally reflowable film. The reflowable film comprises a first film area and a second film area. The reflowable film is one of a thin film and a stack of thin films. The first film area is thermally reflown, the microtoroid is formed in the thermally reflown first film area. The second film area is not reflown in the immediate vicinity of the microtoroid. The microtoroid is optically coupled to the integrated waveguide located on or located within one of or both of the first or second film areas. The first and second film areas are directly connected to each other. The microtoroid has an edge extending along a circumference. The microtoroid can be a non-inverted or an inverted microtoroid, wherein the second film area is inside or outside of the circumference.

18 Claims, 4 Drawing Sheets

(51) Int. Cl.
*G02B 6/132* (2006.01)
*G02B 6/136* (2006.01)
*G02B 6/293* (2006.01)
*H01L 33/58* (2010.01)

(56) References Cited

OTHER PUBLICATIONS

Balakrishnan, M., et al., "Highly stable and low loss electro-optic polymer waveguides for high speed microring modulators using photodefinition", 2006, pp. 61230J-1-61230J-9, vol. 6123, SPIE, Bellingham, WA.

Duchesne, D., et al., "Integrated Optical Hyper-Parametric Oscillator", Mar. 21, 2010, pp. 1-3, IEEE, Piscataway, NJ, USA.

Yao, Jin, et al., "Silicon Microtoroidal Resonators with Integrated MEMS Tunable Coupler", IEEE Journal of Selected Topics in Quantum Electronics, 2007, pp. 1-8, vol. 13.

Armani, D.K., et al., "Ultra-high-Q toroid microcavity on a chip", Nature, Feb. 27, 2003, pp. 925-928, Nature Publishing Group.

International Search Report for International Application No. PCT/EP2011/067934, mailed Feb. 6, 2012.

* cited by examiner (Prior Art)

Distance from center of curvature (µm)   Distance from center of curvature (µm)

Distance from center of curvature (µm)

Legend of Figures 7-9:

Oxide:

Silicon:

Cladding Material(s), back-end material(s):

Mix of oxide and back-end material(s), mix of oxide and cladding material(s)

US 9,268,086 B2

INTEGRATED MICROTOROIDS MONOLITHICALLY COUPLED WITH INTEGRATED WAVEGUIDES

CROSS-REFERENCE TO RELATED APPLICATIONS

This application is the U.S. National Phase of International Application No. PCT/EP2011/067934, filed Oct. 13, 2011, which, in turn, claims the benefit of U.S. Provisional Patent Application No. 61/393,170, filed Oct. 14, 2010, and U.S. Provisional Patent Application No. 61/437,668, filed Jan. 30, 2011, the contents of which are hereby incorporated by reference in their entirety as part of the present disclosure.

FIELD OF THE INVENTION

The invention relates to a photonic apparatus, a method for fabricating a photonic apparatus and a microtoroid. The invention consists in a novel type of integrated resonator that can be monolithically coupled to integrated waveguides while allowing at the same time extremely high quality factors.

BACKGROUND OF THE INVENTION

Microtoroids are a form of integrated resonator that can have extremely high quality factors on the order of 100e6. The geometry and fabrication of microtoroids is taught in "Ultra-high-Q toroid microcavity on a chip" by D. K. Armani, T. J. Kippenberg, S. M. Spillane, K. K. Vahala, Nature 421, 925-928 (2003). In particular, microtoroids can be formed by thermally reflowing a material, so that the surface of the microtoroid can be shaped by surface tension and can be extremely smooth. This is the mechanism that allows such high quality factors, since scattering losses due to surface roughness are almost completely removed. High quality factors are very important for a number of applications such as optical time delay lines, narrow optical notch filters, or light generation in resonators via non-linear processes.

Microtoroids are a form of whispering gallery resonator in that they are essentially a waveguide forming a closed loop in which light can circulate. Due to the manner in which microtoroids are fabricated, they are also substantially planar, in that the height of the looped waveguide is constant relative to the chip surface and determined by the initial position of a thin film out of which the microtoroid is fabricated via a reflow process. In order to distinguish the waveguide forming the microtoroid from the waveguide to which the microtoroid is coupled to in this invention, the former is explicitly referred to as the looped waveguide in the following, while the latter is referred to as the integrated waveguide or coupled to waveguide.

An important drawback of these microtoroids is that they are extremely difficult to couple to integrated waveguides that are fabricated in the same chip than the microtoroids, i.e. to monolithically integrate them with waveguides. This is due to the fact that there is typically no mechanical connectivity between the portion of the thin film out of which the microtoroids are made by locally thermally reflowing said thin film and the remaining portions of said thin film elsewhere on the chip. For this reason, there is no mechanically supportive layer on which or in which a coupled to waveguide can be fabricated without this waveguide being trapped within the circumference of the microtoroid. The thin film out of which microtoroids are made by locally reflowing said thin film is referred to as the reflow film in the following. Monolithic fabrication of both the microtoroid and of the coupled to integrated waveguide would allow ultra precise positioning of the coupled to waveguide relative to the microtoroid, with the accuracy of lithographic feature definition, and would allow removing the high assembly costs incurred when assembling a microtoroid with a discrete fiber or waveguide, i.e. with a coupled to device that is not fabricated on the same chip.

A typical microtoroid is fabricated by starting with a thin-film out of a material that can be thermally reflown, such as a silicon dioxide film, on top of another material, such as for example a silicon substrate. A disk is first etched into the silicon dioxide thin film. The disk is than undercut by partially removing the silicon substrate from below the disk. This partial removal of the silicon is typically achieved with an isotropic etch such as is achieved by etching with gas phase $XeF_2$. This results in a suspended disk located on top of a pedestal and attached to the rest of the chip via said pedestal. The rim of the disk is then locally reflown so that it forms a microtoroid. The reflow process is typically induced by heating with a $CO_2$ laser with a laser wavelength of 10.6 μm. The absorption coefficient of silicon dioxide is much higher than the absorption coefficient of silicon at 10.6 μm, so that the silicon dioxide film can be selectively heated relative to the silicon. Furthermore, the laser spot can be focused onto the disk, so that the silicon dioxide film can be locally heated in the vicinity of the disk. Finally, the silicon pedestal acts as a heat sink, so that the silicon dioxide heats up most at the rim of the disk, where the distance to the pedestal is the largest and the heat sinking the least efficient. This way, with the correct combination of $CO_2$ laser power, exposure time and focusing, the silicon dioxide film can be molten around the rim of the disk while remaining unmolten at the center. The silicon dioxide reflows at the rim forming an extremely smooth microtoroid with a circumference defined by the initial rim. Due to the reflow process, the looped waveguide is thicker than the reflow film out of which it is fabricated, thus forming a structure in which light can be guided.

Light is typically coupled to such a microtoroid from a tapered fiber, and the coupling coefficient between the fiber and the microtoroid tuned by adjusting the distance between the tapered fiber and the microtoroid. The tapered fiber is a suspended structure in the vicinity of the microtoroid in that it is surrounded by air.

Some attempts have been made to couple an integrated microtoroid with an on-chip waveguide. Such a structure is taught in "Silicon Microtoroidal Resonators with Integrated MEMS Tunable Coupler" by Jin Yao, David Leuenberger Ming-Chang M. Lee, and Ming C. Wu, IEEE Journal of Selected Topics in Quantum Electronics, Vol. 13 (2007). In this structure a freestanding Silicon Waveguide is coupled to a non-inverted Silicon microtoroid resonator. This structure is fragile due to the free-standing waveguide, is complicated to fabricated, and it remains unclear whether it can be applied to microtoroids made out of silicon dioxide for which much higher quality factors can be achieved than for silicon microtoroids. It is essentially identical to the one described in the previous paragraphs in that the microtoroid is made by reflowing a disk and in that the coupled to waveguiding element is suspended in air and held in close proximity to the microtoroid.

Other shapes of microtoroids can be fabricated with the above-described method by etching other shapes into the silicon dioxide film, such as racetracks, ovals etc. This results in microtoroid type resonators for which a cross-section, typically a substantially circular cross-section, forms a closed loop mechanically connected to a non-reflown portion of the silicon dioxide film 6 and attached to the rest of the chip via a pedestal connected to said non-reflown portion of the silicon dioxide film. This non-reflown portion connected to the pedestal is inside the circumference of the microtoroid.

SUMMARY OF THE INVENTION

Instead of first etching a disk or other shape such that the remaining reflow film (e.g. silicon dioxide film) is inside the contour of the shape (inside the rim), a hole for which the remaining reflow film is outside of the contour of the shape (outside of the rim) is etched into the reflow film and used as a starting feature (precursor) to define the microtoroid. The remaining reflow film comprises a first film area and a second film area. The remaining reflow film is undercut by partially etching away the substrate. The edge (rim) of the hole and the first film area are then locally reflown. This results in a microtoroid whose circumference is also defined by the rim and that is directly attached to the second film area of the reflow film, i.e. the non-reflown portion of the reflow film via the outer edge of the microtoroid. Said non-reflown portion of the reflow film is connected to the rest of the chip via a section of the substrate material located below the reflow film. The non-reflown portion of the reflow film connected to the microtoroid and to the rest of the chip via the section of substrate material is located outside of the circumference of the microtoroid, and not inside of the circumference. Here too, the microtoroid can take a variety of shapes such as a racetrack, an oval etc. provided the rim of the hole is defined accordingly. This structure is further referred to as an inverted microtoroid.

This results in a structure in which an integrated waveguide can be defined inside the reflow film or on the reflow film in such a way that the waveguide is coupled to the microtoroid, the waveguide is located outside of the circumference of the microtoroid and can be routed to other locations on the chip outside of the circumference of the microtoroid without having to cross the microtoroid, and the waveguide is mechanically supported by the thin film out of which the microtoroid is made by partially reflowing said thin film (the reflow film), so that it does not need to be free standing (suspended) in order to be in close proximity to the microtoroid as is required in order to obtain substantial coupling with the microtoroid. In particular, the integrated waveguide can be in direct mechanical contact with the reflow film in an entire coupling region or in the entire chip.

DETAILED DESCRIPTION OF EMBODIMENTS OF THE INVENTION

Figure 1:
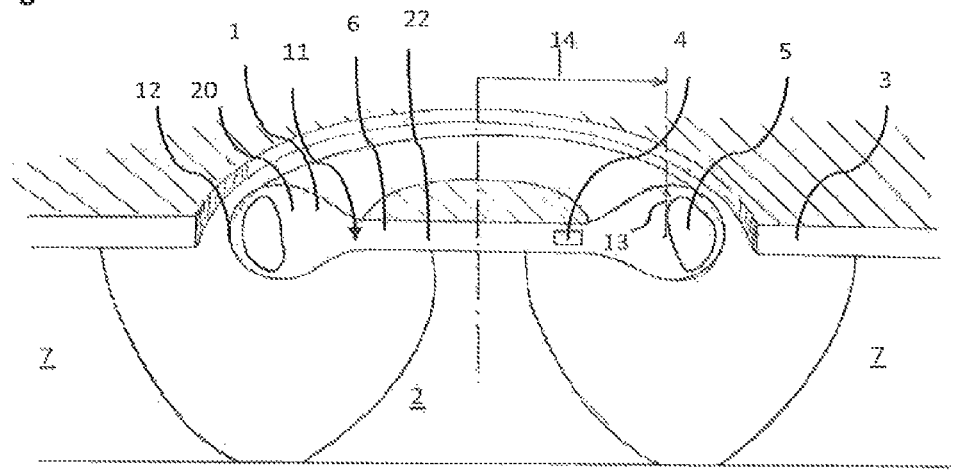
FIG. 1 is a cross-section of a non-inverted microtoroid with a coupled to integrated waveguide.
Figure 2:
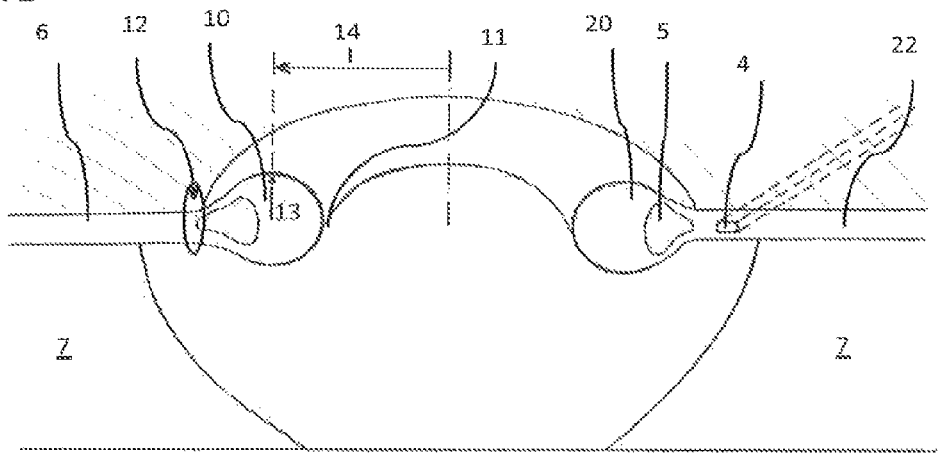
FIG. 2 is a cross-section of an inverted microtoroid coupled to an integrated waveguide.
Figure 3:
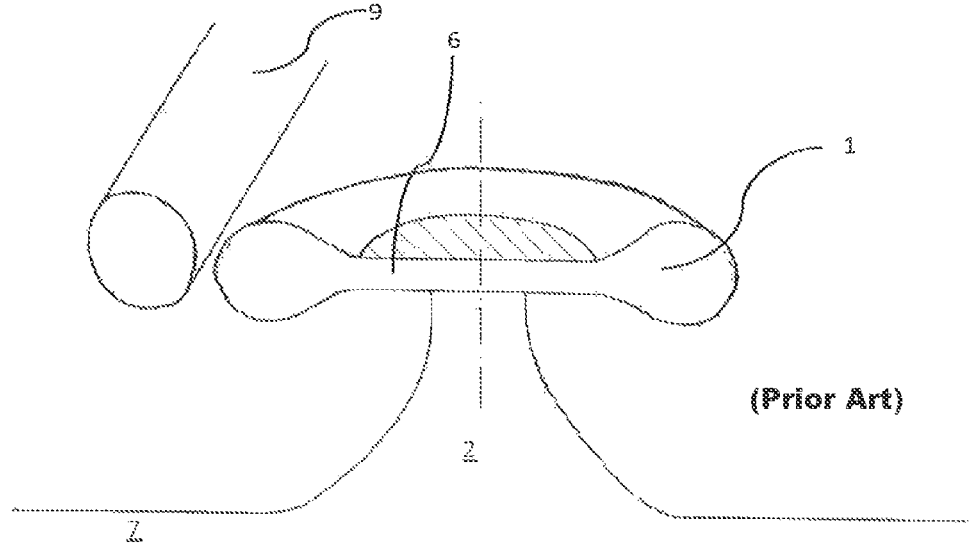
FIG. 3 is a cut through of an non-inverted microtoroid without a coupled to integrated waveguide located on or inside of the reflow film, such as is known in the prior art, is coupled to a tapered fiber suspended in close proximity to the microtoroid, as is also known in the prior art.
Figure 4:
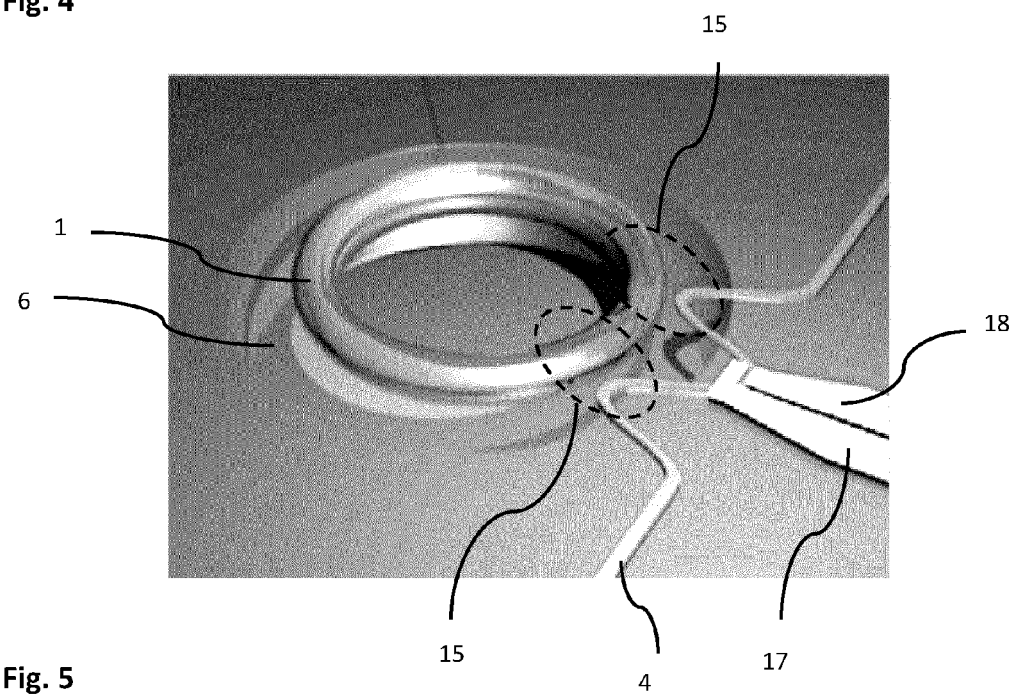
FIG. 4 is a 3D rendering of an inverted microtoroid coupled to an integrated waveguide 4 located on or within the reflow film.
Figure 5:
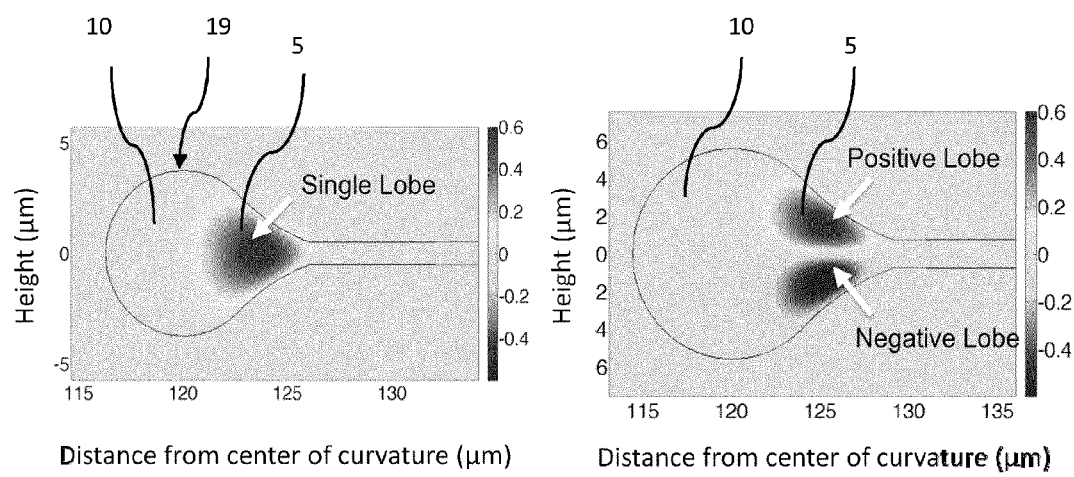
FIG. 5 is a graphical representation of an inverted microtoroid having a thinner reflow film geometry (left) and an inverted microtoroid having a thicker reflow film geometry (right), showing the respective optical modes with low bending losses.
Figure 6:
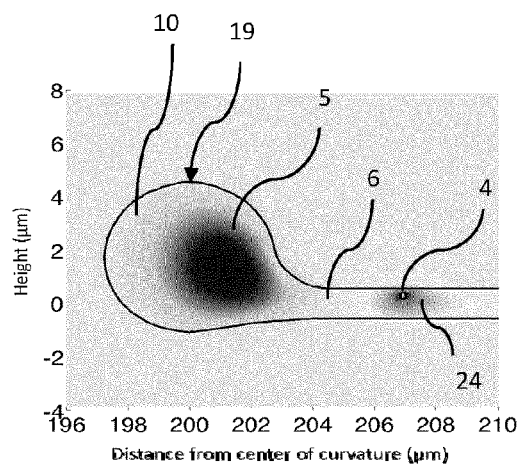
FIG. 6 is a graphical representation of an inverted microtoroid having an off center microtoroid loop waveguide relative to a middle horizontal plane of the reflow film.
Figure 7:
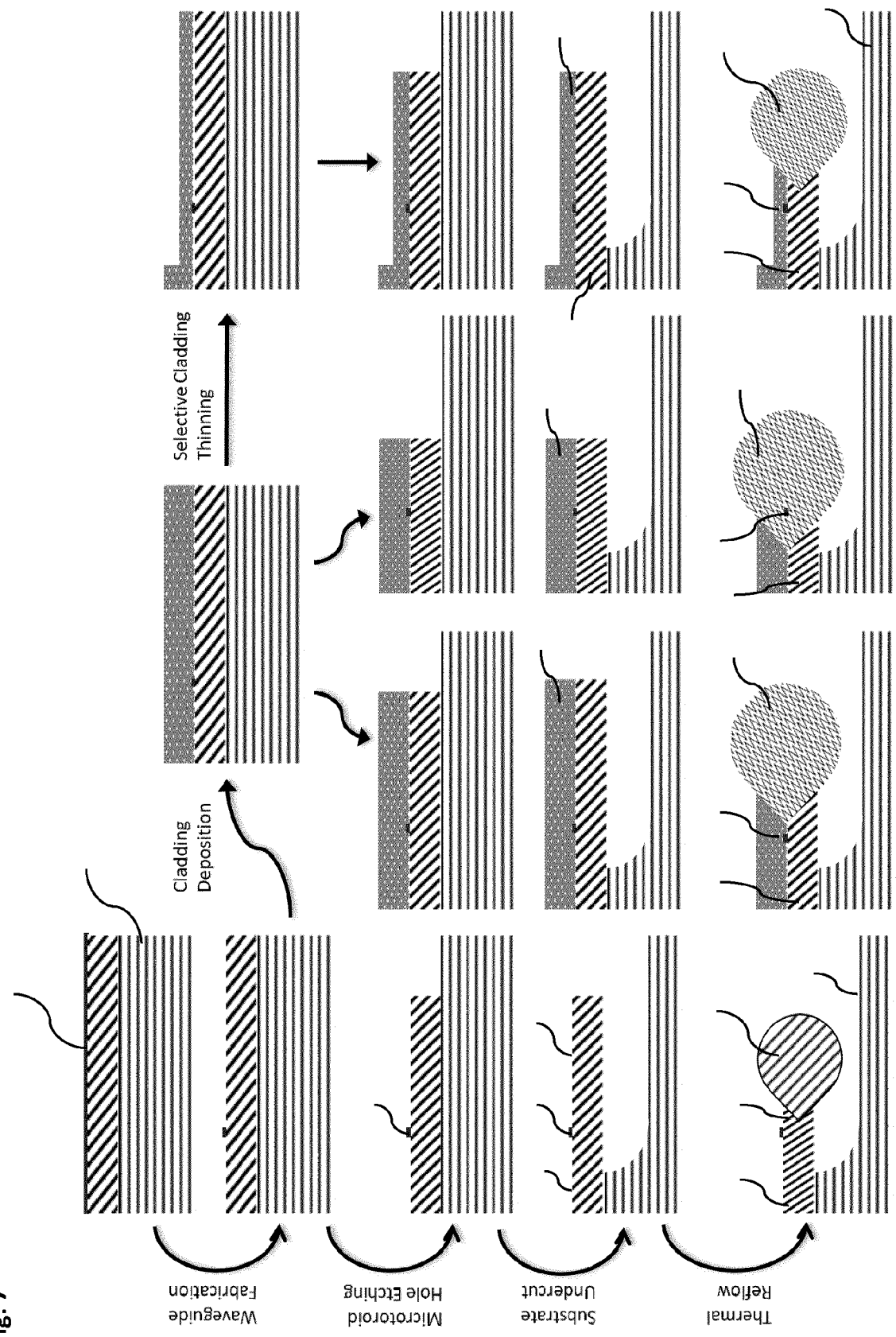
FIG. 7 is a representation of several possible fabrication flows with successive device cross-sections.

The coupled to integrated waveguide core can be made out of a variety of materials provided the refractive index of said materials is at least partially larger than the refractive index of the reflow film. This is required due to the fact that the waveguide core is embedded in the reflow film, or located on the reflow film, so that a higher refractive index is required in order to confine the light within the waveguide core. In the case where the reflow film is silicon dioxide, such a material can for example be silicon, silicon nitride, or silicon oxinitride. The integrated waveguide cross-section can take a variety of shapes, such as a rectangle, a partially etched thin film, or a box shaped cross-section.

In the case of an integrated, coupled to silicon waveguide, a typical fabrication flow consists in starting with silicon-on-insulator (SOI) material, fabricating the waveguide in the top silicon layer 23 of the SOI material, etching the hole whose rim defines the circumference of the microtoroid (the microtoroid precursor hole) such that the hole reaches through the buried oxide (BOX) of the SOI material and down to the bulk silicon (also called silicon handle) acting as the substrate of the SOI material, etching the substrate of the SOI material where it is exposed through the hole so as to undercut the BOX oxide and locally reflowing the BOX oxide around the edges of the hole so as to fabricate the microtoroid. This results in an apparatus in which the coupled to waveguide is located on top of the reflow film.

In the case of a silicon waveguide, another typical fabrication flow consists in starting with silicon-on-insulator (SOI) material, fabricating the waveguide in the top silicon layer of the SOI material, depositing additional dielectric layers (the back-end dielectrics) such as silicon dioxide or nitride poor silicon oxi-nitride or other dielectrics whose reflow temperature is such that it can be reflown by the applied reflow process and whose refractive index is lower than the waveguide core, etching the hole whose rim defines the circumference of the microtoroid (the microtoroid precursor hole) such that the hole reaches through the back-end dielectrics and the buried oxide (BOX) of the SOI material and reaches down to the bulk silicon (also called silicon handle) acting as the substrate of the SOI material, etching the substrate of the SOI material where it is exposed through the hole so as to undercut the BOX oxide and locally reflowing the BOX oxide around the edges of the hole so as to fabricate the microtoroid. This results in an apparatus in which the coupled to waveguide is located within the reflow film and is embedded inside the reflow film.

Optionally, the stack of back-end dielectric layers can also be locally thinned in the region where the microtoroid is later fabricated by local reflow. This is for example useful if the total back-end thickness is too thick for the targeted microtoroid geometry, or if some of the top back-end dielectric layers cannot be reflown and need to be removed in the vicinity of the rim of the hole. This can for example be implemented by an etch prior to the etch defining the microtoroid precursor hole and applied to a region larger than and encompassing the precursor hole. This can also be implemented by an etch applied after the etch defining the microtoroid precursor hole and applied to an area larger than and encompassing the precursor hole. This local thinning of the back-end can also be useful if the back-end contains non-dieletric materials such as metal interconnect layers that need to be removed in the vicinity of the microtoroid circumference prior to fabricating the microtoroid.

Microtoroids can also be coupled to with other types of integrated waveguides, such as waveguides with a silicon nitride core. Here too, the waveguides are typically fabricated first on top of the reflow film or within the reflow film (in which case part of the reflow film is deposited on top of the waveguides), optionally the back-end stack is locally thinned, and the microtoroid precursor hole etched (not necessarily in that order, the hole can also be etched before the back-end is locally thinned), the exposed silicon substrate etched and the BOX oxide undercut at the rim of the hole. Finally the microtoroid is fabricated by local reflow.

Such microtoroids can also be integrated with complex integrated optics, electronics and other on-chip devices. In a preferred fabrication flow the complex integrated optics, including the coupled to waveguide, and the other on-chip devices, including electronic devices such as transistors, are first fabricated, typically such that at the end of this first fabrication flow the back-end does not contain any metals in the region where the microtoroid will later be defined, in particular the region that will be subject to reflow. The back-end stack is then optionally thinned and the microtoroid precursor hole is etched (not necessarily in that order, the hole can also be etched before the back-end is locally thinned), the exposed silicon substrate etched through the hole and the BOX oxide undercut at the rim of the hole. Finally the microtoroid is fabricated by local reflow. In another preferred fabrication flow metal layers are present in the back-end in the region later submitted to reflow, but are etched away as part of the back-end thinning prior to reflow.

Electro-optic devices such as modulators or photodetectors, or electronic devices such as transistors, are typically very sensitive to temperature excursions during fabrication, wherein such temperature excursions can permanently damage these devices if they exceed the thermal budget of the devices. This can be caused for example due to silicide deterioration or due to implant diffusion. In the fabrication flows described here these thermal budgets are not additionally burdened, or not excessively burdened, since the reflow film is only selectively heated due to a combination of local focusing of the $CO_2$ beam and of local heat sinking. The reflow process can take other forms than laser induced heating. For example, the chip can be heated by rapid thermal annealing (RTA) in which case the chip is also heated via exposure to intense radiation. In this case the light is applied to the entirety of the chip, but here too the reflow film such as silicon dioxide is heated faster than the substrate material and the local heat sinking mechanism remains in that most of the reflow film is heat sunk by the underlying substrate and only the undercut regions of the reflow film are not efficiently heat sunk. This way, selective reflow of the reflow film is maintained and the thermal budget of other devices can be maintained. The reflow process can be done with other laser sources emitting a wavelength for which the absorption coefficient in the reflow film is higher than the absorption coefficient of the substrate, or with other radiation sources such as a RTA such that the overall absorption coefficient in the reflow film is higher than the overall absorption coefficient in the substrate (defined as the weighted average of the absorption coefficients over the spectral density of the radiation source).

After selective reflow of the reflow film and definition of the microtoroid, the microtoroid can be embedded in an additional material such as a transparent epoxy, a non-linear polymer (for example with second order or third order optical non-linearities), or another microtoroid cladding material. Such layers are typically at least partially organic and spin coated onto the chip. Such materials can also be used to implement a bio-detector or a chemical detector if their optical properties such as index of refraction or optical absorption are dependent on the presence of a detected species. Such microtoroid cladding materials can also be a liquid that can be flown over the microtoroid.

These fabrication flows also allow fabricating a non-inverted microtoroid with a disk precursor, or other precursor such that the non-reflown portion of the reflow film connected to the microtoroid is located within the circumference of the microtoroid, but such that the microtoroid is monolithically coupled to a waveguide located within or on the reflow film.

The waveguide would then be confined to the region located within the circumference. Since such a microtoroid typically has dimensions of 10 to a few 100 µm across (for example the diameter of the disk) and at most a few mm across, this leaves very little space to implement the rest of the on-chip optical system and to couple to and from this on-chip optical system. Permanent attachment of off-chip optical elements such as a fiber array or a planar lightwave circuit coupled to the on-chip optical circuit typically requires large areas, larger than the area within the circumference of the microtoroid. Unless the microtoroid is embedded in an additional cladding material, this is difficult to achieve without touching the microtoroid, with the risk of destroying the mechanical integrity of the microtoroid, or at least its optical properties due to the close proximity of the other off chip elements. For this reason, the inverted microtoroid geometry for which the non-reflown portion of the reflow film to which the microtoroid is attached is located outside of the circumference of the microtoroid is preferred when coupling a waveguide to the microtoroid. In such a case coupled to waveguides can be routed far enough from the inverted microtoroid to allow attachment of large off-chip optical elements without touching or otherwise impacting the microtoroid. It also allows the rest of the optical system to fill up to the entire area of the chip outside of the circumference of the microtoroid.

One possibility to protect the mechanical and optical properties of the microtoroid is to apply a material to the chip such that it covers the microtoroid, apply a curing step such that said material becomes solid or at least highly viscous such as thermal curing, ultra-violet curing or chemical curing and only attach off-chip elements that could otherwise damage or impact the microtoroid after the curing step. This corresponds to encapsulating the microtoroid in order to protect it from further assembly steps.

Another possibility to protect the mechanical and optical properties of the microtoroid is to apply a material to the chip such that it covers the microtoroid, to hold further off-chip elements at a sufficient distance from the microtoroid so as not to compromise the mechanical or optical properties of the microtoroid, and to cure the material so as to attach and hold the off-chip elements at a sufficient distance.

One of the difficulties in designing and fabricating the inverse microtoroid structure is that light can be poorly confined to the microtoroid, leading to high radiative bending losses and to low quality factors if the structure is not carefully designed and fabricated. Bending losses and radiative losses are used interchangeably in this invention description.

In a bent region of the looped waveguide forming the microtoroid, the optical field is concentrated in the region of the bent loop waveguide towards the outer region of the bend and partially radiates out of the loop waveguide. In the inverted microtoroid geometry, the microtoroid is typically attached to the reflow film at the outer edge of the microtoroid and thus the outer region of the bend. This is for example always the case if the circumference of the microtoroid forms a convex shape such as a circle or a racetrack. The proximity of the reflow film at the outer edge of the loop waveguide bend typically worsens radiative losses, since light can couple into the reflow film that has a higher index than the rest of the material surrounding the microtoroid.

In general, a thinner reflow film in the non reflown portion, a thicker looped waveguide forming the microtoroid (i.e. with a larger cross-section), and a larger outer microtoroid bending radius lead to reduced bending losses. Acceptable bending losses can be achieved. For example, an inversed microtoroid with a reflow film thickness of 1 µm, a bending radius of 120 µm and a microtoroid inner radius of 3.7 µm leads to a radiation losses limited quality factor larger than 100e6, at which point one can assume that quality factors will be limited by material properties such as optical absorption through the material of the reflow film and residual scattering. This quality factor was calculated for the ground mode of the microtoroid loop waveguide, i.e., the mode for which the loop waveguide has the highest effective index and that has a single lobe mode profile.

For thick reflow film geometries the radiative losses of the ground mode of the loop waveguide can become excessive, but higher order loop waveguide modes can maintain sufficiently low radiative losses to result in quality factors in excess of 100e6. For example an inversed microtoroid with a reflow film thickness of 1.5 µm, a bending radius of 120 µm and a microtoroid inner radius of 5.6 µm maintains a radiation losses limited quality factor in excess of 100e6 for a higher order loop waveguide mode that has two lobes in the vertical direction (perpendicular to the chip surface), while the quality factor of the ground mode is much lower. This is due to the fact that the higher order mode has an odd symmetry in the vertical dimension and cannot couple to the ground mode of the reflow film that has an even symmetry. This assumes that the symmetry plane of the reflow film is not substantially broken by the loop waveguide.

The radiative losses for the higher order loop waveguide mode are lower in the previous case due to the opposite symmetry of the higher order loop waveguide mode relative to the ground mode of the non-reflown reflow film. This assumed a microtoroid loop waveguide that maintains the symmetry of the reflow film, i.e., that is symmetric relative to a horizontal plane passing through the middle of the reflow film. However this symmetry can be broken by the reflow process in that the microtoroid loop waveguide is typically off center with a loop waveguide center point that is higher than the middle plane of the reflow film (where higher refers to further above the surface of the chip). In an extreme geometry the microtoroid is pulled high enough such that the reflow film is connected to the lower edge of the loop waveguide. Even in such an extreme geometry it is possible to maintain a radiative quality factor larger than 100e6. This is for example the case for the ground mode of a microtoroid with a bending radius of 200 µm, an inner radius of 2.75 µm, and a reflow film thickness of 1.1 µm.

Due to the fact that high bending losses can occur due to the attachment of the reflow film at the outer edge of the bend when the dimensions of the inversed microtoroid are not chosen carefully, it is not intuitive to one skilled in the art that such a structure can be a high quality factor optical resonator.

Another difficulty consists in implementing the integrated waveguide that is coupled to the microtoroid and is located on or within the reflow film. This is due to the fact that there are typically conflicting requirements on the reflow film thickness from the point of view of maintaining a high quality factor resonance in the microtoroid and fabricating a coupled to integrated waveguide with low substrate losses. These conflicting requirements do not occur when the substrate has a refractive index that is substantially lower than the core of the integrated waveguide. However, the substrate is typically silicon and the waveguide core made out of silicon or out of a material with a lower refractive index than silicon, so that waveguide losses due to light coupling from the waveguide to the substrate can be an issue. Since the waveguide is spatially separated from the substrate by the portion of the reflow film located below the waveguide, a thick reflow film is desirable in order to reduce substrate coupling losses.

In the asymmetrical microtoroid loop waveguide geometry described above, a silicon waveguide can for example be embedded such that it is covered by 200 nm of the reflow film as a top cladding layer, such that the waveguide is 220 nm thick in the vertical direction and such that 680 nm of reflow film is located below the waveguide as a bottom cladding layer separating the waveguide from the substrate. This results in a total reflow film thickness of 1.1 µm compatible with previously described geometries. For this geometry the substrate coupling losses for a 500 nm wide waveguide are for example on the order of 2 dB/cm and remain acceptable. On places of the chip where straight waveguides are simply routing light, they can be made wide and multi-mode to maximize the confinement of light inside the core area and minimize substrate losses. On the other hand in the coupling region to the microtoroid, the waveguide is typically tapered to a much thinner cross-section, but over a sufficiently short distance for substrate coupling losses to remain acceptable. The integrated waveguide in the coupling region is also typically within or on a region of the reflow film that is undercut, further reducing substrate coupling losses.

A further difficulty resides in phase velocity mismatch between the microtoroid loop waveguide and the coupled to integrated waveguide. Phase velocity matching is required in order to be able to obtain high coupling between the integrated waveguide and the microtoroid loop waveguide. Since the microtoroids typically have very high quality factors, very small coupling coefficients can be sufficient even in order to obtain critical coupling, a coupling strength such that all the power from the waveguide is dropped into the microtoroid at resonance. However, there are limits on the allowable phase velocity mismatch in order to achieve targeted coupling coefficients. In particular, a good phase velocity matching allows the realization of longer coupling sections, so that the minimum distance between the microtoroid loop waveguide and the integrated waveguide can be increased in the coupling region. This is important, since an excessively small distance between the integrated waveguide and the loop waveguide would lead to an excessive reduction of the quality factor of the microtoroid due to loop waveguide scattering losses induced by the presence of the integrated waveguide.

Phase velocity matching or sufficiently reducing phase velocity mismatch can be challenging since the core of the microtoroid is made out of the reflow film while the core of the integrated waveguide is made out of a material with a higher refractive index. For this reason the effective index of the integrated waveguide is typically higher than the effective index of the loop waveguide. This does not however mean that it is always the case. First, by locally reducing the dimension of the integrated waveguide core in the vicinity of the coupling region, typically by reducing the width, that is to say the waveguide cross-section dimension in the direction parallel to the surface of the chip, the overlap of the waveguide mode with the cladding is increased and the effective index of the waveguide reduced. Furthermore, the waveguide mode of the integrated waveguide also overlaps with the cladding regions outside of the reflow film. For example, if these outside cladding regions are air, or another material with a lower refractive index than the reflow film, the effective index of the waveguide can even be locally reduced below the refractive index of the reflow film, or matched to the refractive index of the reflow film. The effective index of the loop waveguide is typically very close to the refractive index of the reflow film since it is a large, typically multi-mode waveguide made out of the material of the reflow film and the excited modes are typically low order modes. In the asymmetrical waveguide example described above, the effective index of the integrated waveguide can be matched to the effective index of the loop waveguide if the width of the silicon core of the integrated waveguide is locally reduced (tapered down) to 160 nm. If the distance between the center of the loop waveguide to the integrated waveguide is 6.9 µm the coupling coefficient is such that a 6 µm coupling length is sufficient to obtain critical coupling assuming an unloaded quality factor of 100e6 for the microtoroid. Locally reducing the waveguide core cross-section of the integrated waveguide in the coupling region not only helps to achieve phase velocity matching but also increases the modal overlap between the integrated waveguide and the loop waveguide, so that coupling between the waveguides is also enhanced.

Since the integrated waveguide is typically tapered down to a reduced cross-section in the region where it is coupled with the microtoroid, its mode is also less confined to the waveguide core in this region and has a higher overlap with the regions outside of the reflow film. For this reason, the integrated waveguide is typically at least partially located on the reflow film or within the reflow film in a region where the reflow film is undercut. Otherwise the integrated waveguide mode would reach down to the substrate and leak into the substrate. The loop waveguide mode also needs to substantially reach the integrated waveguide core in order to couple to the integrated waveguide. This is another reason why the integrated waveguide is typically at least partially located in a region where the reflow film is undercut, since otherwise the loop waveguide mode would also reach the substrate and leak into the substrate in the region where it reaches the integrated waveguide. Both constraints do not apply if the substrate has a lower refractive index than the reflow film.

The integrated waveguide is typically also at least partially located in a region where the reflow film is not undercut, since it is typically routed away from the microtoroid over a substantial distance. The width of the undercut region is typically at most a few 10 s or a few 100 s of µm, and typically between 1 to 30 µm. Since the regions where the coupled to integrated waveguide, or other integrated waveguides optically connected to the couple to waveguide are not located on or within an undercut reflow film are efficiently heat sunk via the chip substrate and do not heat up as much during the reflow step, these regions are preferred for the location of devices with a low thermal budget such as can be the case for modulators, switches, photodetectors, interleavers, multiplexers or other opto-electronic devices. Since the undercut regions typically heat up substantially during reflow, they are typically regions where devices with a low thermal budget are not located.

Typical dimensions for the toroid outer radius, or for the smallest bending radius of the microtoroid loop waveguide, are between 25 µm and 5 mm. In many applications it is beneficial to keep the circumference as small as possible, to maintain a high free spectral range, a high finesse, or to highly enhance the optical field intensities within the microtoroid. In order to maintain a high quality factor, bending radii are then typically between 50 µm and 1 mm. Typical buried oxide layers and typical reflow films are between 400 nm and 3 µm. Below 400 nm the substrate coupling losses are excessively high for the integrated waveguide, on the order of 100 dB/cm. Above 3 µm, the reflow film is so large that it becomes very difficult to fabricate microtoroids with sufficiently low radiative losses to maintain a high quality factor. When optimizing the trade-off between integrated waveguide substrate losses and microtoroid bending losses, the resulting optimum buried oxide layers or reflow films are between 550 nm and 1.5 µm. The inner radius of the microtoroid is typically between 0.8 times to 6 times the reflow film thickness (or the largest vertical dimension of the loop waveguide is between 1.6 and 12 times the reflow film thickness).

In a preferred embodiment the microtoroids and the coupled to integrated waveguides are fabricated out of silicon on insulator (SOI) material. The substrate of the apparatus is the bulk silicon (also called silicon handle or silicon substrate) of the SOI material. The coupled to waveguide is fabricated in the top silicon layer of the SOI material including a tapered region of the waveguide where the waveguide has a cross-section substantially below the maximum dimension still allowing single mode transmission, with the width of the waveguide typically below 50% of the maximum width still allowing single mode transmission. Additional process steps such as etching, chemical mechanical polishing, implantations and material growth can be used to fabricate further optical, electro-optic or electronic devices. Additional back-end layers can be deposited after fabrication of said waveguide, including reflowable layers and including metal interconnect layers. A hole is etched into the chip (including processing at the chip or at the wafer level) corresponding to the precursor for the inverted microtoroid and reaching down into the silicon handle. The silicon of the silicon handle exposed through the hole is etched in such a manner as to undercut the buried oxide for a long enough distance such that the coupled to waveguide is typically at least partially located on an undercut region of the buried oxide, and so that the waveguide portion that is undercut at least partially corresponds to the tapered down region of the silicon waveguide. The rim of the precursor hole is then reflown to create the microtoroid. Optionally, a back-end thinning etch can be selectively applied to the chip in the vicinity of where the microtoroid is located in the finished good, either prior to etching the precursor hole, after etching the precursor hole, or after the silicon substrate etch, but before the reflow step. The reflow film then corresponds to the buried oxide as well as remaining reflowable back-end layers after back-end thinning deposited on top of the buried oxide, such as deposited silicon dioxide or deposited silicon oxi-nitride layers.

Typical top silicon SOI layer thicknesses are between 100 nm and 350 nm. In the coupling region, the minimum distance between the integrated waveguide and the microtoroid is typically between 500 nm to 10 µm, measured as the length between the waveguide and the inner edge of the inverted toroid (where the loop waveguide ends into the remaining hole), minus the largest vertical dimension of the microtoroid (i.e., essentially equal to the distance between the integrated waveguide and the center of the loop waveguide minus the inner radius).

In a preferred embodiment the microtoroids and the coupled to integrated waveguides are fabricated out of silicon on insulator (SOI) material. The substrate of the apparatus is the bulk silicon (also called silicon handle or silicon substrate) of the SOI material. The coupled to waveguide is fabricated in the back-end of the chip, i.e., in layers deposited on top of the chip, for example with a waveguide core containing silicon nitride or amorphous silicon. Other optical, electro-optic and electronic devices can be fabricated, including silicon waveguides with a core defined in the top silicon layer of the SOI material as well as coupling structures that allow coupling light back and forth between the silicon integrated waveguides and the back-end integrated waveguides. Additional back-end layers can be deposited after fabrication of said waveguides, including reflowable layers and including metal interconnect layers. A hole is etched into the chip corresponding to the precursor for the inverted microtoroid and reaching down into the silicon handle. The silicon of the silicon handle exposed through the hole is etched typically in such a manner as to undercut the buried oxide for a long enough distance such that the coupled to waveguide is at least partially located on an undercut region of the buried oxide. The rim of the precursor hole is then reflown to create the microtoroid. Optionally, a back-end thinning etch can be selectively applied to the chip in the vicinity of where the microtoroid is located in the finished good, either prior to etching the precursor hole, after etching the precursor hole, or after the silicon substrate etch but before the reflow process. The reflow film then corresponds to the buried oxide as well as reflowable back-end layers remaining after back-end thinning deposited on top of the buried oxide, such as deposited silicon dioxide or deposited silicon oxi-nitride layers.

Similar structures can also be fabricated by starting with an oxidized silicon wafer, wherein said oxide at least partially corresponds to the reflow film and wherein additional materials are deposited on top said oxide out of which the core of the coupled to integrated waveguide is fabricated, including amorphous silicon, silicon oxi-nitride and silicon nitride.

Similar structures can also be fabricated wherein the reflow material entirely corresponds to back-end layers deposited on top of the chip and wherein the coupled to integrated waveguide is part of the back-end stack of the chip. This is for example compatible with fabricating these coupled microtoroids on bulk silicon (non SOI) chips where a substantial portion of the optical devices is also defined in the back-end of the chip.

It is understood that described processing steps can occur at the chip or at the wafer level.

In this invention description, the inverted microtoroid is defined as being connected to the non-reflown portion of the reflow film such that said non-reflown portion of the reflow film is located outside of the circumference of the microtoroid. Reflow film is synonymous with reflowable film. Connected means here that the microtoroid is connected to a film with essentially the same material or materials as the microtoroid, the reflow film, with material that is essentially the same as the microtoroid, without interruption. In other words, the mechanical connection occurs all with essentially the same material, since the microtoroid is made by reflowing the reflow film and is thus directly connected to the reflow film. In the case where the reflow film is entirely made out of a unique material such as silicon dioxide, the material of the reflow film, of the microtoroid and of the connection is all exactly the same. In the case where the reflow film is composed out of several films, the material of the reflow film, of the microtoroid and of the connection is essentially the same, with the only distinction being that the several films are completely or partially mixed within the microtoroid.

The circumference of the microtoroid precursor, for example a hole for an inverted toroid or a disk for a non-inverted toroid, has an unambiguous circumference since these objects are essentially 2D objects. In the case of a microtoroid, which is a 3D object, the circumference is defined as the loop formed by the line where the reflowable film is interrupted at the edge of the microtoroid when looking top down onto the top surface of the chip, i.e. for a non-inverted microtoroid it is the furthest the reflowable film extends from the center of the microtoroid or equivalently it is given by the outer edge of the microtoroid and for an inverted microtoroid it is the closest the reflow film approaches the center of the microtoroid or equivalently it is given by the inner edge of the microtoroid.

The precursor hole for an inverted microtoroid can also be a ring shaped hole if an unetched region is left around the center of the structure, thus forming an isolated island, or more complicated shapes as long as the microtoroid is formed by thermally reflowing the outmost edge of said hole, since features located inside the hole do not impact the fabrication or functionality of the microtoroid. In this case the inverted microtoroid is not directly connected to the unetched regions left over within the circumference of the microtoroid, since they are isolated islands.

The etched regions defining the precursor for a non-inverted toroid typically take the form of a ring shaped hole, wherein the inner edge of the ring shaped hole corresponds to the circumference of the precursor and is the locus where thermal reflow is applied. The outer edge of the hole is not directly connected to the inner edge of the hole and does not impact the reflow process or the functionality of the microtoroid. If larger areas are etched during precursor shape definition, the etched region can take a different form as long as the microtoroid is formed by thermally reflowing an inner edge of said hole. For example the hole can cover the entire chip with the exception of the microtoroid precursor, or the hole can cover the entire chip with the exception of the microtoroid precursor and other regions not directly connected to the microtoroid precursor.

Directly connected refers to continuous connection of two portions of reflowable film via further portions of reflowable film.

FIG. 1 shows the cross-section of the structure. A microtoroid 1 is formed by reflowing a first film area 20 of reflow film 6 such that the reflow film 6 is located within the circumference of the microtoroid. The film 6 is attached to the rest of the chip via a second film area 22 and a pedestal 2. The rest of the reflow film 3 is outside the circumference of the microtoroid and is not directly connected to the microtoroid (the gap between the reflow film 3 and the microtoroid 1 can be air, vacuum, some organic or partially organic material, or some other material different from the material or materials of the reflow film). An integrated waveguide 4 is located within the reflow film connected to the microtoroid and is trapped within the circumference of the microtoroid, since there is no direct connectivity between the portion 6 of the reflow film and the portion 3 of the reflow film. The microtoroid is formed by looping a loop waveguide supporting an optical mode 5. The chip substrate 7 is etched and undercuts the reflow film where it forms the microtoroid. The loop waveguide and the microtoroid have an inner edge 11 where it is connected to the reflow film and an outer edge 12 where it is not connected to the reflow film. The geometry of the microtoroid can be described by the inner radius 13 and the outer radius 14, the latter when the circumference is circular, or by a bending radius 14 for more general shapes.

An inverted microtoroid 10 is connected to the reflow film 6 located outside of the circumference of the microtoroid. It is formed by looping a loop waveguide that supports an optical mode 5. The microtoroid has an inner edge 11 where it is not connected to the reflow film and an outer edge 12 where it is connected to the reflow film. A coupled to integrated waveguide 4 is located inside the reflow film outside the circumference of the microtoroid and is not confined to the circumference of the microtoroid. The microtoroid geometry can be described by an inner radius 13 and an outer radius 14 when the circumference is circular, or by a bending radius 14.

The integrated waveguide 4 is coupled to the microtoroid in two coupling regions 15. The integrated waveguide 4 is further electrically contacted with two metal traces 17 and 18 such that the metal traces and the active waveguide area connected by the metal traces are in the non-undercut region of the reflow film 6 so as to minimize thermal exposure during the reflow process. In this example the active waveguide area can for example be used to induce a phase shift and thus to adjust the overall coupling strength between the microtoroid and the integrated waveguides. In general there might be one or several coupling regions between the integrated waveguide and the inverted microtoroid.

A line 19 represents the edge of the reflow film and of the microtoroid. Higher optical field intensities are represented by darker areas within the microtoroid and the reflow film. In the case of the thicker reflow film structure described above, the low loss mode 5 is not the ground mode as in the case of the thinner reflow structure described above, but a higher order mode that has two lobes in the vertical direction.

An integrated waveguide 4 located within the reflow film 6 is coupled to an inverted microtoroid 10. Even though it is not visible in the chosen scaling of the color map, the microtoroid mode 5 (equivalently the loop waveguide mode 5) actually reaches to the integrated waveguide core 4 so that the microtoroid and the integrated waveguide (equivalently the loop waveguide and the integrated waveguide) are coupled to each other. The figure also shows the integrated waveguide mode 24.

The leftmost flow corresponds to the fabrication of an inverted microtoroid such that the integrated waveguide 4 made from a silicon layer 23 is located on the reflow film. The second flow is a flow such that the integrated waveguide 4 is located inside the reflow film but outside of the reflown region, i.e., the integrated waveguide is located in the second film area 22 of the reflow film. The third flow is a flow such that the integrated waveguide 4 is located inside the reflow film and inside of the reflown region, i.e. in a first film area 20. The forth flow is a flow where the back-end is thinned prior to the reflow process. These fabrication flows are particularly well suited to fabrication stating with a silicon on insulator (SOI) material, in which case the silicon layer 23 is then the top silicon layer of the SOI material (sometimes called the device layer in the electronics literature).

Figure 8:
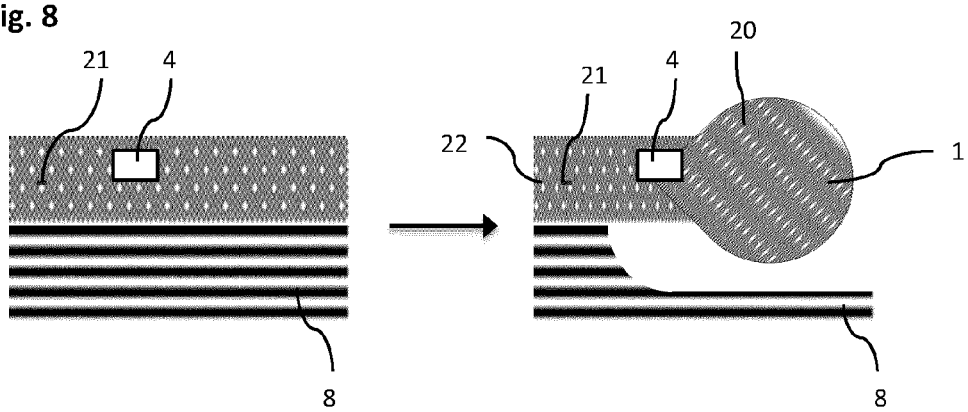
FIG. 8 is a representation of a microtoroid coupled to an integrated waveguide with a Silicon Nitride core.

A silicon waveguide 21 is also shown in order to illustrate that the chip can contain other types of integrated waveguides than the coupled to integrated waveguide 4. FIG. 8 also illustrates that most of the fabrication of the integrated optics and other devices such as electronic devices can occur before the microtoroid fabrication. This figure can be applied to an inverted or a non-inverted microtoroid.

Figure 9:
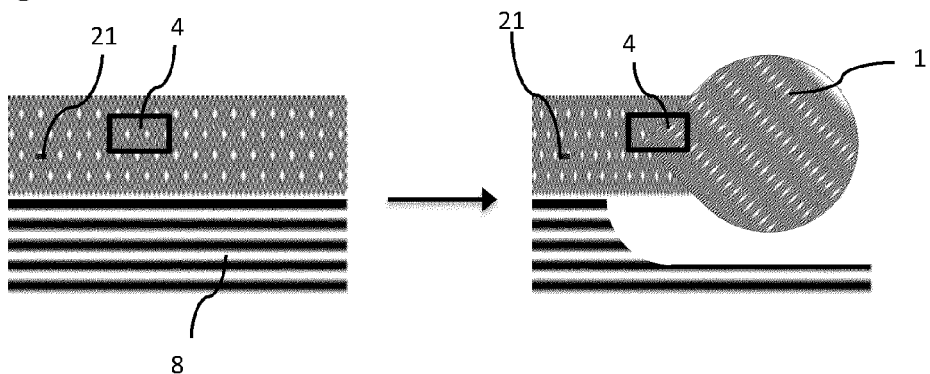
FIG. 9 is a representation of a microtoroid coupled to an integrated waveguide with a box shaped Silicon Nitride core.
Figure 9:
Figure 9:
Figure 9:
Figure 9:
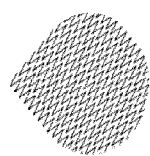

FIG. 9 shows one example of a hollow core waveguide coupled to the microtoroid. A silicon waveguide 21 is also shown in order to illustrate that the chip can contain other types of integrated waveguides than the coupled to integrated waveguide 4. The box shaped waveguide core is a hollow core filled with a material with a lower refractive index than the box, such as materials constituting the reflow film. The hollow core can also be filled with air or vacuum. This figure can be applied to an inverted or a non-inverted microtoroid.

What is claimed is:

1. A photonic apparatus comprising:
   an integrated waveguide, an integrated resonator in the form of a microtoroid and a thermally reflowable film, wherein:
   said reflowable film is defined by one of a thin film and a stack of thin films and comprises a thermally reflown first film area and a second film area directly connected with the first film area,
   said microtoroid is formed in said thermally reflown first film area, and said second film area is not reflown in the immediate vicinity of the microtoroid,
   said microtoroid is optically coupled to said integrated waveguide located on or within at least one of said first or second film areas, and
   said microtoroid having an edge extending along a circumference of the microtoroid.

2. The apparatus of claim 1, wherein the integrated waveguide comprises a silicon waveguide, a silicon nitride waveguide, a silicon-oxinitride waveguide, an amorphous silicon waveguide or another waveguide that contains silicon.

3. The apparatus of claim 1, wherein the microtoroid and the integrated waveguide are made on a silicon-on-insulator chip and the reflowable film is at least partially constituted out of buried oxide of the silicon-on-insulator material.

4. The apparatus of claim 1, wherein said second film area is located outside of the circumference, and said microtoroid is an inverted microtoroid.

5. The apparatus of claim 1, wherein said second film area is located inside of the circumference, and said microtoroid is a non-inverted microtoroid.

6. The apparatus of claim 1, wherein the microtoroid is at least partially made out of a silicon-on-insulator material and the reflowable film is at least partially constituted out of buried oxide of the silicon-on-insulator material.

7. The apparatus of claim 1, wherein the integrated waveguide is located outside of the circumference of the microtoroid.

8. A method of fabricating a photonic apparatus comprising an integrated waveguide and an integrated resonator in the form of a microtoroid coupled to said integrated waveguide, said method comprising the following steps:
   fabricating an integrated waveguide in, or on top of, a reflowable film or a stack of reflowable films;
   etching a shape defining a circumference into the film or stack of thin films;
   etching into material or materials below the reflowable film or stack of reflowable films undercutting the reflowable film or stack of reflowable films at the circumference of the shape by etching into the material or materials below the reflowable film or stack of reflowable films; and
   forming a microtoroid by thermally reflowing the reflowable film or stack of reflowable films at the circumference of the shape,
   wherein the step of etching the shape includes etching the shape with said circumference close to the waveguide such that the microtoroid is optically coupled to the integrated waveguide, wherein the shape comprises a hole, and wherein the forming step comprises reflowing an outermost edge of the hole to create an inverted microtoroid.

9. The method of claim 8, wherein a core of the integrated waveguide is fabricated out of silicon, silicon nitride, silicon oxi-nitride, amorphous silicon, or is at least partially made out of another material containing silicon.

10. The method of claim 8, wherein:
the fabricating step comprises fabricating the integrated waveguide at least partially out of one of (i) a top silicon layer of a silicon-on-insulator material, or (ii) a thin optical film or multiple thin optical films deposited onto a silicon-on-insulator material; and
the step of etching the shape includes etching the shape into the silicon-on-insulator material so as to reach a silicon handle of the silicon-on-insulator material;
the method further comprises etching the silicon handle so as to undercut buried oxide at the circumference of the shape, and
the thermally reflowing step comprises thermally reflowing the buried oxide and other layers located on top of the buried oxide at the circumference of the shape, thereby forming the microtoroid, wherein the buried oxide and other layers located on top of the buried oxide at the circumference of the shape at the time the reflowing step is performed comprise the reflowable film or stack of reflowable films, so that the integrated waveguide is located on or within the stack of partially reflown layers.

11. The method of claim 10, wherein:
the shape comprises one of a disk, a racetrack, an oval, or another shape with a circumference configured such that the buried oxide remaining in a vicinity of the circumference is located inside the circumference,
the step of etching the shape includes etching the buried oxide and the other layers located on top of the buried oxide at the circumference of the shape outside the circumference of the shape in an immediate vicinity of the circumference of the shape, and
the formed microtoroid is a non-inverted microtoroid.

12. The method of claim 10, wherein:
the shape is a hole having an outmost edge in the shape of a circle, a racetrack, an oval, or another shape,
said outmost edge defines the circumference of the shape such that the portion of the buried oxide remaining in a vicinity of the circumference is located outside the circumference,
the step of etching the shape includes etching the buried oxide and the other layers located on top of the buried oxide at the circumference of the shape inside the circumference of the shape in an immediate vicinity of the circumference of the shape, and
the formed microtoroid is an inverted microtoroid.

13. The method of claim 11, further comprising the step of partially removing the film or stack of films located on top of the buried oxide in the vicinity of the circumference of the shape, and thereby thinning the film or stack of films, prior to the thermally reflowing step and (i) prior to etching the shape, (ii) after etching the shape but prior to undercutting the buried oxide film, or (iii) after undercutting the buried oxide film but prior to thermally reflowing the buried oxide film and layers remaining on top of the buried oxide film in the vicinity of the circumference.

14. The method of claim 12, further comprising the step of partially removing the stack of films located on top of the buried oxide in the vicinity of the circumference of the shape and thinning the stack of films prior to the thermally reflowing step, wherein said thinning can take place prior to etching the shape, after etching the shape but prior to undercutting the buried oxide film, or after undercutting the buried oxide film but prior to thermally reflowing the buried oxide film and layers remaining on top of the buried oxide film in the vicinity of the circumference.

15. The apparatus of claim 4, wherein said microtoroid is not directly connected to further portions of the reflowable film located inside the circumference.

16. The apparatus of claim 4, wherein said circumference defines a hole covering an entire area within the circumference or defines the outmost edge of a hole having a more complex shape.

17. The apparatus of claim 5, wherein said microtoroid is not directly connected to further portions of the reflowable film located outside of the circumference.

18. The apparatus of claim 5, wherein said circumference defines an inner edge of a ring shaped hole or an inner edge of a differently shaped hole.

* * * * *